(12) United States Patent
Permingeat

(10) Patent No.: US 6,223,989 B1
(45) Date of Patent: May 1, 2001

(54) METHOD FOR MAKING SMART CARDS, AND RESULTING CARDS

(75) Inventor: Vincent Permingeat, Marseille (FR)

(73) Assignee: Gemplus S.C.A., Gemenos (FR)

( * ) Notice: Subject to any disclaimer, the term of this patent is extended or adjusted under 35 U.S.C. 154(b) by 0 days.

(21) Appl. No.: 09/230,850

(22) PCT Filed: Aug. 5, 1996

(86) PCT No.: PCT/FR96/01246

§ 371 Date: Mar. 4, 1999

§ 102(e) Date: Mar. 4, 1999

(87) PCT Pub. No.: WO98/06062

PCT Pub. Date: Feb. 12, 1998

(51) Int. Cl.[7] .................................................. G06K 19/00
(52) U.S. Cl. ........................ 235/487; 235/492; 361/737
(58) Field of Search ................................... 235/487, 492, 235/494; 361/736, 737

(56) References Cited

U.S. PATENT DOCUMENTS

| 4,871,405 | 10/1989 | Denda . |
| 4,903,118 | 2/1990 | Iwade . |
| 5,169,056 | 12/1992 | Reele . |
| 5,612,532 | * 3/1997 | Iwasaki ................................. 235/492 |
| 5,671,525 | * 9/1997 | Fidalgo ................................. 235/488 |
| 5,776,278 | * 7/1998 | Tuttle et al. ............................ 29/855 |

FOREIGN PATENT DOCUMENTS

| 4229639 | 12/1993 | (DE) . |
| 0717371 | 6/1996 | (EP) . |
| 2579799 | * 3/1985 | (FR) ............................... G06K/19/06 |

* cited by examiner

Primary Examiner—Karl D. Frech
Assistant Examiner—Daniel St. Cyr
(74) Attorney, Agent, or Firm—Roland Plottel

(57) ABSTRACT

An improvement to a method for making cards with an electronic module is disclosed. The method comprises the steps of providing a card body (1) having a cavity (3, 4), an electronic module (5I) shaped to fit said cavity, and at least one first adhesion means (12c–15c) adherable to the card body and the module, depositing at least said first adhesion means in said cavity, inserting said module into the cavity in a substantially centered position, and pressing at least said first adhesion means between the card and the module. The method further comprises a step of providing a second adhesion means (11b) which is also deposited in the cavity (3, 4). said second adhesion means is capable of having sufficient tackiness to maintain the module (5) in a centered position in the cavity, at least until said first adhesion means has been pressed. The cards produced by carrying out the method are also disclosed.

12 Claims, 3 Drawing Sheets

METHOD FOR MAKING SMART CARDS, AND RESULTING CARDS

BACKGROUND OF THE INVENTION

1. Field of the Invention

The present invention relates to an improvement to a method for making smart cards, of the type having a card body and an electronic module, and cards obtained by implementing the method.

2. Description of the Related Art

Of the existing methods, a method is known of furnishing a card body with a cavity, an electronic module having principally contact pads and a semiconductor chip containing an integrated circuit, and of securing the electronic module in the cavity with gluing means such as a cyanoacrylate glue. In general, the gluing operation is divided into a prior operation in which the module is inserted into the cavity, and a pressing operation of a predetermined length.

However, practical implementation of such a method, usually called "encartage" in French, on an automated industrial scale, which requires separate sequenced operations carried out at different stations, and transferring cards from one station to the next at high speed, on the order of several thousand cards an hour, leads to several problems affecting the quality of the finished product.

In particular, the inventor has found that the cards obtained by gluing using the operations listed above often have major drawbacks.

The principal drawback is incorrect centering of the module in the cavity. Despite correctly centered insertion of the module in the cavity, the inventor found that after gluing some modules were off-center, i.e. had shifted from their initial insertion position. Typically, incorrect centering was slight rotation, or translation, or both at the same time inside the cavity, or in extreme cases outside the cavity with the contact pads having one edge overlapping the surface of the card body.

The inventor found that the incorrect centering resulted in particular from forces produced on the card while it was being moved from one station to another, particularly sudden acceleration or deceleration forces brought about by the card leaving the insertion station and stopping at the pressing station, respectively.

Incorrect centering can also result from residual constraints present in the module which tend to produce a slight inward curvature. In this case, there is a risk of the module popping out of the cavity with each acceleration or deceleration referred to above.

Defects relating to poor adhesion of the module to the card body have also been found. In these situations, the card cannot meet the mechanical strength criteria imposed by current standards (ISO and AFNOR) for bending, twisting, and separating forces.

SUMMARY OF THE INVENTION

It is accordingly necessary to solve these problems without decreasing production rates.

The present invention relates to an improvement to the method of gluing an electronic module into a card body that can be compatible with automated very-high-speed industrial production without thereby generating defects involving module centering or adhesion.

For this purpose, the present invention relates to a method for making electronic module cards of the type in which a card body with a cavity is provided with an electronic module whose dimensions match the cavity, and at least a first gluing means is adherable to the card body and to the module, including the steps wherein at least the first gluing means is deposited in the cavity, the module is inserted into the cavity in a substantially centered position, and at least the first gluing means is pressed between the card and the module.

The method is characterized in that it additionally has a step of providing a second gluing means which is also deposited in the cavity, the second gluing means being able to exhibit gluing properties that are sufficient to keep the module centered in the cavity at least until the first gluing means is pressed.

Because of the use of this second gluing means with gluing properties (adhesion and high viscosity), the cards can be subjected to any acceleration or deceleration during manufacture without incorrect centering* being affected thereby.

In addition, it is possible significantly to decrease the time taken by inserting the module and hence to increase production speeds.

The invention also enables the first gluing means to be selected and used under optimum conditions so that it can better withstand module separating forces and bending/twisting forces.

According to one advantageous embodiment of the method, the second gluing means is selected from materials able, after processing, to withstand separating and/or bending/twisting forces and the material is used in a way that withstands such forces.

Thus, the second gluing means, when properly treated, has the additional function of contributing, with the first gluing means, to withstanding the separation and/or bending/twisting forces imposed by the current standards referred to above.

According to one preferred embodiment, a light-curable epoxy resin is used. This resin can be subjected to ultraviolet radiation prior to insertion of the module if it is also intended eventually to fulfill a mechanical strength function thus contributing to the mechanical strength of the card body plus module.

Because of this method of implementation, activation of the dot of the second gluing means can be favored effectively and independently of environmental operating conditions. In addition, it is easy to change the kinetics of the resin polymerization reaction by changing the intensity and exposure time of the resin to the ultraviolet radiation.

According to another characteristic that gives good module holding results, the resin has a viscosity of 50,000 m.P/second.

According to another characteristic that gives good results and for reasons of convenience in implementing the method, a drop of 0.003 gram is deposited in the center of the cavity, and the resin is exposed to radiation so that its open time is approximately 60 seconds.

According to a second embodiment of the method, a cyanoacrylate glue gel is used under appropriate temperature and relative humidity conditions before inserting the module.

The use of this gel is advantageous because the gel can be used under economical conditions.

According to another characteristic of gel use with good module-holding results, a drop is deposited in the center of the cavity under temperature and relative humidity conditions that allow an open time of approximately 60 seconds.

According to another characteristic of the method, according to the first or second embodiment, the method may use a cyanoacrylate type glue as the first gluing means.

This glue has the advantage of being convenient and economical to use.

This first gluing means can be deposited in a quantity such that, after pressing, a gluing area of between 50 and 100% of the area of the cavity is covered, in the form of at least four lateral glue dots in the location of the contact pads at a temperature of 18 to 24° C. and a relative humidity of between 60 and 75%.

Such operating conditions allow high-speed industrial production with few defects, the first gluing means being a cyanoacrylate glue.

According to another preferred characteristic of the method, cyanoacrylate glue is deposited just before the insertion step.

In this way, better results are achieved in terms of cyanoacrylate glue adhesion to the module.

According to another characteristic of the method, the cyanoacrylate glue chosen is preferably relatively pure, the open time of the cyanoacrylate glue being approximately 60 seconds under the above operating conditions.

Thus, this glue provides better adhesion because it polymerizes relatively slowly.

The present invention also relates to an electronic module card obtained according to the above method.

Other characteristics and advantages of the invention will emerge more clearly by reading the description hereinbelow of two principal embodiments provided solely as examples. It should be read with reference to the attached drawings wherein:

DESCRIPTION OF THE PREFERRED EMBODIMENTS

The method of the invention will now be described in accordance with a first embodiment implemented with reference to FIGS. 5 to 12.

The method of the invention requires provision of a card body with a cavity and an electronic module whose dimensions match those of the cavity.

Figure 1:
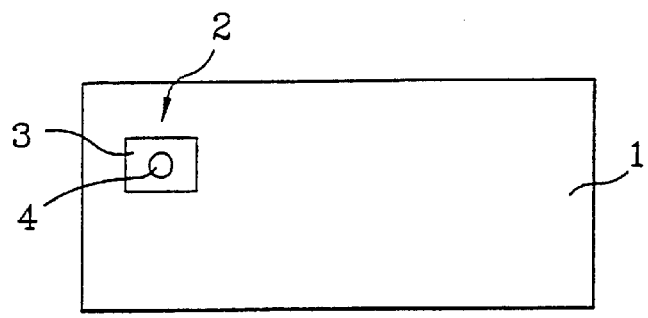
FIG. 1 represents a card body that can be used in the method of the invention.

FIG. 1 shows an example of a smart card 1 that can be used by the process. It has a cavity 2 that can be obtained by casting at the same time as the card body, or by machining.

Card bodies of this type are standardized by ISO and AFNOR, and accordingly have predetermined dimensions.

Figure 4:
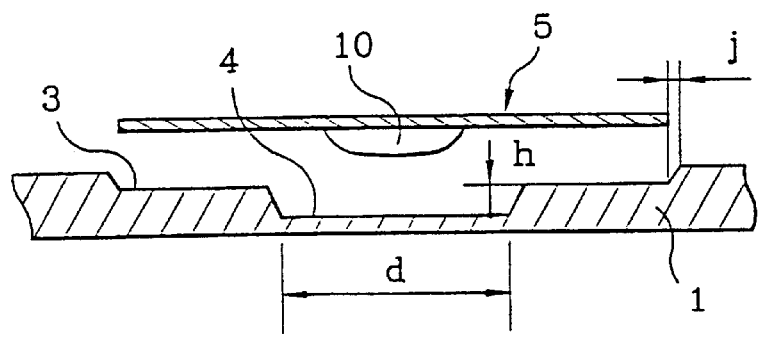
FIG. 4 is a schematic view showing the arrangement of the module relative to the card.

The cavity must accommodate the module. It can thus have shapes that vary according to the module used. In this example it is composed of two hollows: a first hollow 3 of generally rectangular shape terminating at the front surface of the card, and a second hollow 4 of generally circular shape, deeper than the first, disposed in the center of the rectangle and terminating at the bottom of the first hollow. The second hollow has a diameter d of 8.2 mm and a height h of 0.6 mm (FIG. 4).

The material used, generally plastic, depends on the applications. Thus, for example, telephone cards or telecards are made of ABS (acrylonitrile butadiene styrene), but can also be made of PVC (polyvinyl chloride), or laminated with polycarbonate (PC), for example PC/ABS or PC/PVC.

In the example, a cavity according to the ISO standard is used, and ABS is used for the material of the card body.

Figure 2:
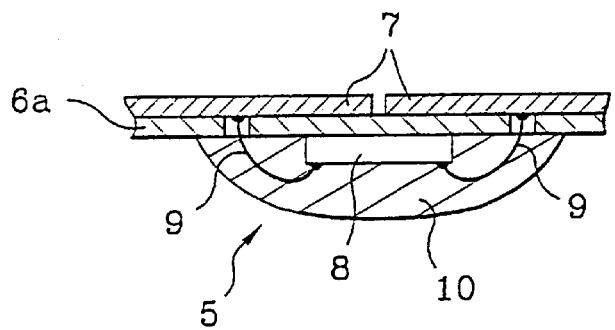
FIG. 2 is a cross section of an electronic module that can be used in the method of the invention.
Figure 3:
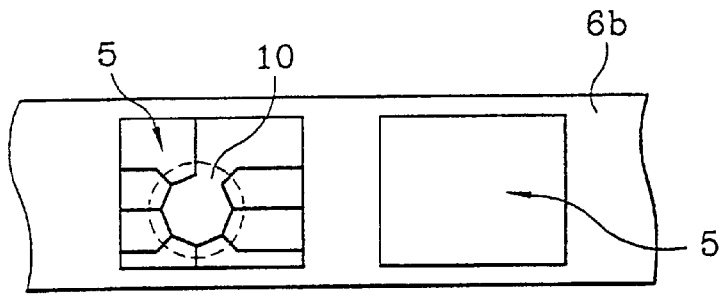
FIG. 3 is a top view of an electronic module backing film.

The electronic module 5 (FIGS. 2 and 3) generally has a backing film 6a made of synthetic insulating material, contact pads 7 made of conducting material, a silicon chip 8 containing an integrated circuit, leads 9 connecting the chip to the contact pads, and a coating resin 10 covering the chip and the connecting leads.

The coating, generally thermosetting epoxy resin, forms an elevation that may have irregular dimensions, particularly of thickness. In the best case, this elevation can be milled smooth to a more precise thickness to facilitate the operation of gluing the module into the card body. Preferably, the goal of the invention is to use the elevation directly without milling.

The module (FIGS. 2 and 3) may be of several types, for example of the laminated leadframe type with a backing film made of polyimide or another type having an epoxy backing film.

In the example, the module is of the laminated leadframe type and thus has a lower polyimide surface. It is supplied from a continuous film 6b (FIG. 3) and presented on a roll.

The cavity of the card is designed to receive the module as shown schematically in FIG. 4. For this purpose, hollow 4 is associated with elevation 10, while hollow 3 is associated with contact pads 5 with the necessary assembly play (J). This play is such that a simple rotation of the module in the plane of the card or translation in this same plane can be detected with the naked eye and is hence a centering defect.

With the method, at least one first gluing means able to adhere to the card body and the module is also supplied. Adhesion generally occurs after curing or treatment. In the case of electronic module cards, the gluing means have the function of withstanding separating and/or bending/twisting forces according to the standards referred to above.

The first gluing means may be of various types. It may for example be based on a liquid cyanoacrylate glue and deposited in the form of dots or beads. It can also be made of a thermoadhesive or thermoplastic material and deposited in the form of a film. It may be added to the card body or may be part thereof as for example in French Patent 2,579,799. It may be deposited on the body or on the module.

The examples described employ a cyanoacrylate glue deposited in the cavity along a preferred trace as described below and illustrated in FIG. 5.

The method includes steps in which the first gluing means is deposited in the cavity or on the module, preferably in the cavity, the module is inserted into the cavity in a substantially centered position, and at least the first gluing means is pressed between the card and the module. Such steps will be described in detail in an embodiment illustrated in FIGS. 7 to 12.

The method of the invention is characterized by additionally having a step of supplying, and also depositing in the cavity, a second gluing means able at least to hold the module centered in the cavity (against the forces tending to shift it off-center) at least until the first gluing means is pressed.

According to the invention, the second usable gluing means includes materials able to have gluing properties. "Gluing material" is understood to be a material that not only adheres to the plastics employed for the card bodies but also has a high viscosity as explained below. The adhesion must be such that the module does not peel off under the forces it encounters until pressed. As an example of such a material one may cite in particular a single-component resin, a cyanoacrylate glue gel, a thermosetting epoxy resin, etc. These materials must also be highly viscous by comparison to a cyanoacrylate glue currently used with a viscosity of approximately 190 mP/s. The material is considered highly viscous by comparison to the above cyanoacrylate glue if the viscosity of the material is more than ten times the viscosity of the above cyanoacrylate glue. Preferably, a viscosity a factor of 100 or higher is used.

In the example, a single-component light-curable epoxy resin is used (although it is not cured in this example) which is advantageous because it has a single component and adheres well to the ABS and the polyimide module film. In the example, this resin is deposited in the cavity according to a step illustrated in FIG. 7.

When the viscosity of this resin was 50,000 mP/second, the module held very well in the centered position when subjected to acceleration forces equivalent to those in a high-speed industrial system according to the invention, an example of which is described below.

The total volume of gluing material depends in particular on the spot where it is deposited (volume available in the cavity), its adhesion properties, its viscosity, and the forces it must withstand.

It may have a total volume corresponding to a quantity of between 0.002 and 0.004 gram when deposited in a single dot. This volume may however be divided into several dots, for example four 0.001 gram dots in the case where the resin is deposited at the side in the first hollow.

In the example, the resin that held the module very well had a viscosity of 50,000 mP/s and was deposited in the form of a drop with a volume corresponding to 0.003 gram in the center of the cavity. These values are compatible with a manufacturing procedure using for example a system as described below in which the cards are transferred from one station to another by fingers that strike them at the rear edge, which brings about high acceleration forces.

It may be deduced that, under gentler manufacturing conditions, i.e. with lower card transfer forces, it is possible to reduce the quantity and/or viscosity of the resin.

The cyanoacrylate glue used in the examples as the first gluing means is deposited in the location of the contact pads in the form of four lateral dots of glue each weighing 0.001 gram along a trace as described below.

Various means of depositing a drop of cyanoacrylate glue of a given quantity at a given time known to the individual skilled in the art can be used. The same applies to the resin-dispensing means. The resin used is preferably of the single-component thixotropic type so that it can be dispensed in a manner compatible with high manufacturing speeds.

The choice of a highly viscous material for an industrial system requiring very rapid dispensing to accommodate high manufacturing speeds runs counter to the preconceived notion that the more easily and rapidly a material is to be dispensed, the less viscous and adhesive it must be. In fact, thanks to the thixotropic nature of the resin and despite its being highly viscous and adhesive, it can be dispensed very easily and rapidly, contrary to this notion. Such an epoxy resin is supplied in particular by the Delo company under no. 4597.

As far as the environmental operating conditions for cyanoacrylate glue are concerned, it has been found that when the temperature and relative humidity are too low, polymerization of the glue is too slow, with the risk that the module will peel off and be displaced from the center (with the risk that polymerization will contaminate the surface: "blooming"). Conversely, it has been found that when the temperature and relative humidity are too high, polymerization of the glue is too rapid, which also entails the risk of peeling and has the disadvantage of fouling and clogging the needle used for dispensing the glue. Also, it has been found that when the relative humidity is too low there are risks of static electricity. Static electricity strongly attracts drops of cyanoacrylate glue which can be deposited randomly and generate defects.

Good mechanical strength results in terms of separation, bending, and twisting were obtained when the cyanoacrylate glue was treated or used at a temperature of 18 to 24° C. and a relative humidity of between 60 and 75%.

Advantageously, because of the immediate module holding function of the second gluing means according to the invention, a relatively pure cyanoacrylate glue can be chosen, which produces its effects over a relatively long period of time in order to optimize adhesion quality, for example a time of over 60 seconds.

In this example, the open time of the glue is approximately 60 seconds under the above environmental operating conditions. "Open time" is the time during which it is still possible to cause an object to adhere to the glue. The longer this time, the better is the polymerization. This polymerization may end where appropriate after the pressing operation.

Figure 5:
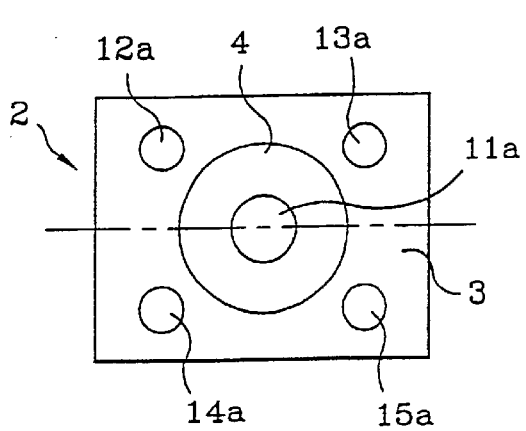
FIG. 5 is a diagram of a cavity viewed from above with a trace for depositing glue dots.

The embodiment of the method uses a preferred trace such as that illustrated in FIG. 5, which shows the cavity with dots 11a to 15a. It has a central dot 11a in chip hollow 3, and four other dots, known as lateral dots, 12a to 15a, located in hollow 4 of the contact pads and the corners of this hollow.

Figure 6:
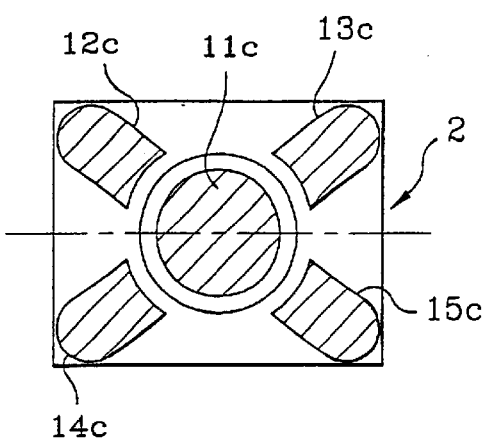
FIG. 6 represents the gluing areas of the gluing means on the cavity after pressing.
Figure 7:
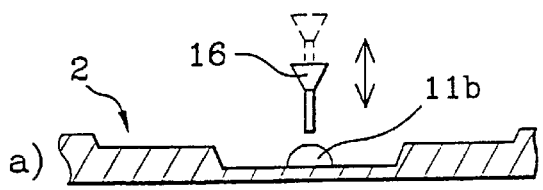
FIGS. 7 to 12 represent the various steps of the process, or the various operating stations of a system.
Figure 9:
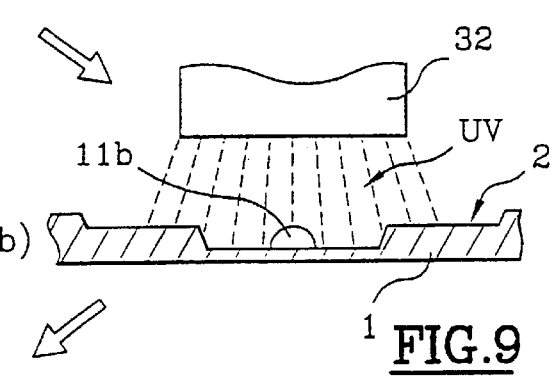

The four lateral dots enable a gluing area of between 50 and 100% of the area of the cavity to be covered after pressing (FIG. 6). Pressing is done such that the thickness of the cyanoacrylate bond is approximately 0.02 mm. The print left by the spreading of each lateral dot of glue defines a semicircular area in the general shape of a "U" which extends substantially radially from near the edge of the second hollow 4 to near the corner of the rectangle delimited by the first hollow, with the base of the "U" pointing to the corner. This provides sufficient adhesion for the module to withstand the forces imposed by the standards referred to above.

According to a preferred embodiment of the invention, the cyanoacrylate glue is deposited just before the pressing step, and in any event after the first gluing means has been deposited. It will be understood that in this way the glue retains its maximum polymerization potential and hence adheres maximally to the module when the latter is inserted and pressed against it.

In the embodiment, FIGS. 7 to 12 can represent both the steps of the process and the successive operating stations of a system as described below.

Figure 8:
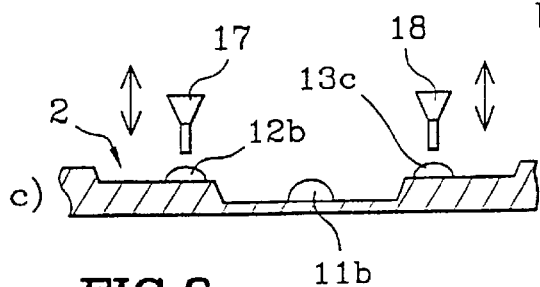

At a first station (FIG. 7) and in a first step a), first a drop of resin 11*b* is deposited in the center of the cavity with dispensing means 16, then the card is transferred to the next station (FIG. 8).

Figure 10:
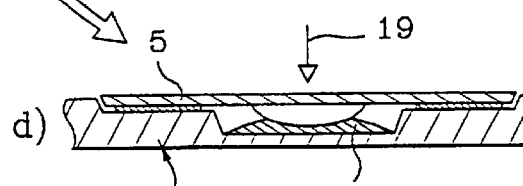

At this station, and in a second step b), four drops of cyanoacrylate glue 12*b* to 14*b*, known as lateral drops, are deposited in the four corners of the upper hollow with the aid of other dispensing means 17 and 18, and the card is transferred to a station known as an insertion station (FIG. 10).

Figure 11:
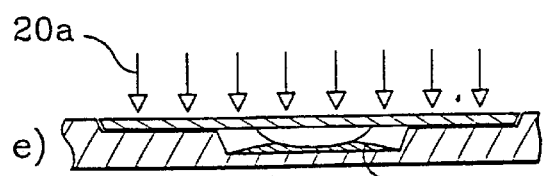
Figure 12:
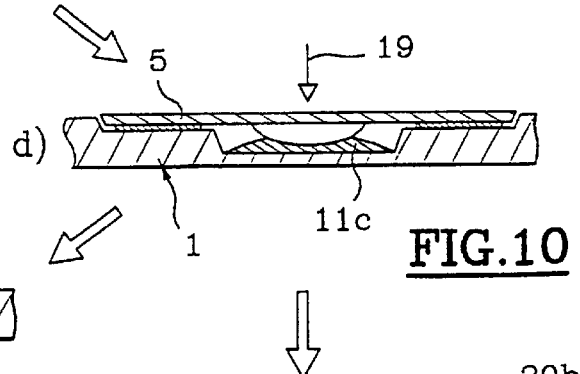
Figure 12:
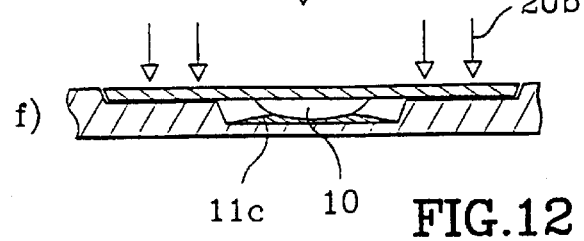

At the insertion station, according to another method step d), an electronic module 5 is inserted with insertion means 19, the insertion time in this example being 300 ms but being reducible still further, and the card is transferred to the pressing station (FIG. 11 or, according to a preferred alternative, FIG. 12).

At the pressing station (FIG. 11), according to another method step e), the gluing means are pressed, applying a force of approximately 34 daN for 22 seconds using pressing means 20*a*.

According to the preferred pressing alterative, in a step f), pressing is done only at the periphery of the contact pads using pressing means 20*b*, which has the advantage of pressing the glue properly with no risk of introducing mechanical stresses that could damage the semiconductor chip or the connecting leads.

As explained above, the elevation in the coating may have slightly varying thicknesses. In extreme cases, the elevation may abut the bottom of the cavity and hence create a central point of the module that is slightly higher than the contact pads, which are flush with the surface of the card body. Such configurations, frequently encountered in industrial manufacturing, prohibit application of the pressure necessary for good-quality adhesion.

Figure 13:
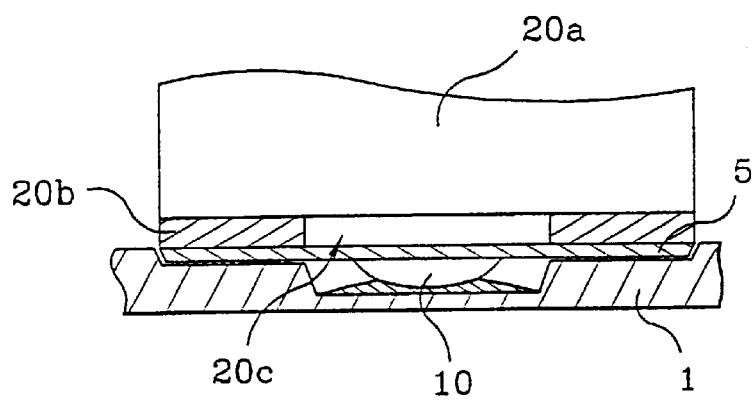
FIG. 13 represents pressing means.

One example of the pressing means 20*b* that can be used is described below in connection with FIG. 13.

In the next step (not illustrated), the card is evacuated or undergoes pretreatment, which completes the insertion operation.

According to one advantageous characteristic of this method, the material of the second gluing means is used so that it produces its effects of withstanding separating and/or bending/twisting forces.

Although the resin fully performs its module-holding function without exposure to ultraviolet radiation, it is preferable to cure it if only to avoid harmful microcracks under the contact pads between two prints or gluing areas 12*c* to 15*c* (FIG. 6). As they harden, certain viscous materials such as the resin above or a cyanoacrylate glue gel advantageously exhibit properties of mechanical resistance to separating and/or bending/twisting forces.

If epoxy resin is used, the method according to the first embodiment has an additional step during which polymerization is initiated by subjecting the epoxy resin to ultraviolet radiation, with this step preceding insertion of the module.

In the example, this step is preferably carried out (FIG. 9) just after the step in which the drop of resin described above is deposited.

The intensity and duration of exposure are regulated here such that the open time of the resin is greater than 60 seconds, with this time corresponding to that of the cyanoacrylate glue used. For industrial application at the speeds referred to above, the exposure time ranges from 0.5 to 1 second. The intensity can be regulated both by the power of the bulb used and by the distance from the resin.

Alternatively, the resin can be irradiated later at the same time the drops of cyanoacrylate glue are deposited.

It will be understood that the gap in time between activation of the first and second gluing means and the pressing step is minimized, as only one station separates it from the pressing station, so that better-quality gluing can be done as the pressing time is maximized relative to the open time of each gluing means.

The various steps of the method of the invention will now be described according to a second embodiment.

In this second embodiment, a cyanoacrylate glue gel is used instead of the epoxy resin.

This gel also has properties allowing the module to hold firm while subjected to forces pushing it off-center during manufacture.

It is used in an identical volume as the epoxy resin and with similar deposition steps, except that there is no additional step for activating the gluing means. Indeed, gel activation occurs as in the case of cyanoacrylate glue, with in particular identical operating conditions in terms of temperature and relative humidity.

It will be understood that activation of this second means is easier and more economical. There are no ultraviolet radiation generating means to be implemented, and these are particularly expensive.

Figure 15:
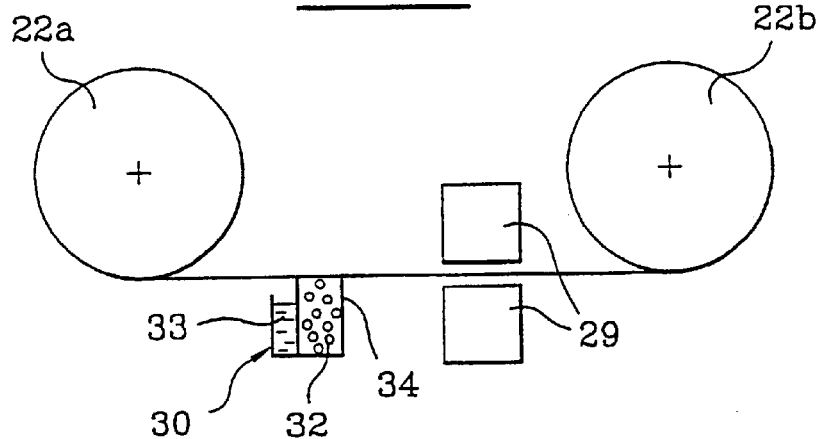
FIG. 15 shows the alcohol moistening means.

Other activation means known to the individual skilled in the art are also possible. Thus, for example, the film of the module can be treated by moistening with alcohol to initiate polymerization of the cyanoacrylate glue gel in contact with the module. Such means are described in FIG. 15.

The insertion and pressing steps are identical to those described for the resin.

Figure 14:
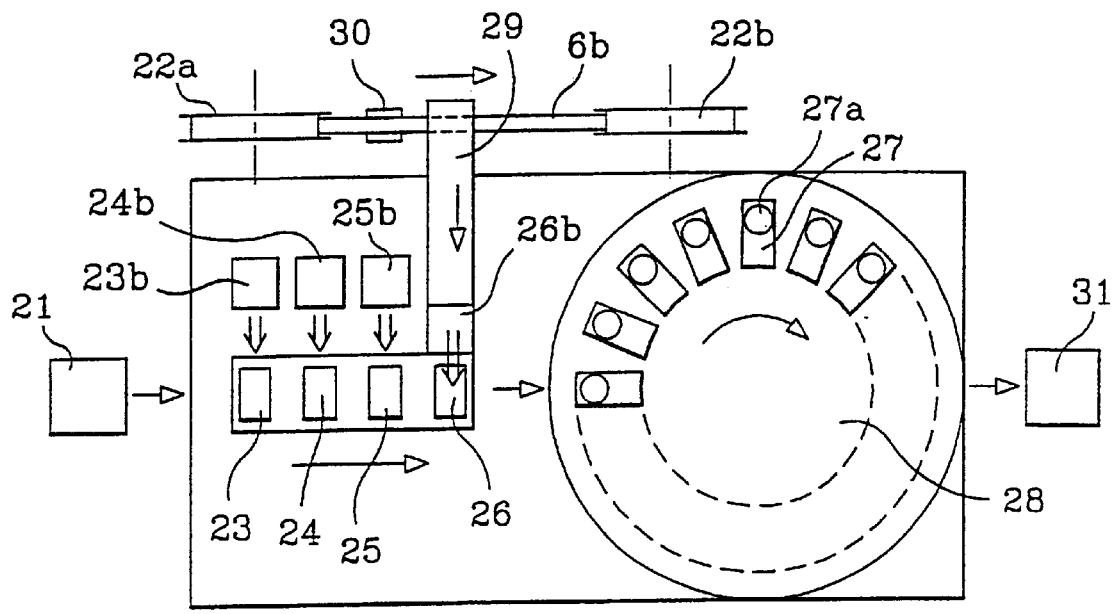
FIG. 14 is a top view of an example of a system for carrying out the method at high speed.

An example of a high-speed industrial system in the method according to the invention will now be described with reference to FIG. 14.

It has card supply means 21 for supplying a plurality of card bodies, module supply means 22*a*, 22*b* for supplying a plurality of modules, a resin drop dispensing station 23 equipped with resin dispensing means 23*b*, an ultraviolet irradiation station 24 equipped with ultraviolet irradiation means 24*b*, a cyanoacrylate glue drop dispensing station 25 equipped with dispensing means 25*b* having two needles 16 and 17, a module insertion station 26 equipped with insertion means 26*b*, pressing stations 27 equipped with pressing means 27*a* disposed at the periphery of a carousel 28 which supports the cards during the pressing time, means 29 for cutting up the modules and transferring them to the insertion station, means 30 for moistening with alcohol if appropriate, then removal means 31. The system also includes an enclosure with controlled temperature and relative humidity (not shown).

The supply means are two rolls, a first roll 22*a* loaded with a film 6*a* supporting the modules and a second roll 22*b* supporting the film from which modules are absent, one paying out while the other winds up. If appropriate, the film passes by means 30 for moistening with alcohol described hereinbelow before passing by module cutting means 29.

Resin dispensing means 23 have a hollow needle 16 which can move up and down.

The irradiation station is connected to ultraviolet (UV) radiation generating means of a known type employing elongate optical means 32 (FIG. 9) able to bring the radiation (UV) to a point near the resin in such a way as to expose only the cavity to radiation, as certain marks on the card are sensitive to ultraviolet radiation.

The cyanoacrylate glue dispensing means have two hollow needles 17, 18 (FIG. 8) which can move vertically and transversely.

The modules are extracted from film 6*a* by cutting means and taken with the aid of transfer means 29 to the insertion station where they are inserted in the center of the cavity of each card. It is especially during the film-cutting operation that residual strains are released and are responsible for the curving of the module as explained above.

Each pressing station 27 is provided with pressing means 27*a* having a vertically movable end 20*a* (FIG. 13) that comes in contact with the module. To implement pressing optimally, this end is provided with a blanket 20*b* with a hole in the middle so that pressure can be applied only to the periphery of the module. The blanket is made of an elastomer material able to distribute the pressure without affecting the contact pads. It is rectangular in shape, corresponding to the shape of the module. The diameter of the central hole 20*c* corresponds substantially to the diameter of the second hollow.

The means 30 (FIG. 1) for moistening the lower surface of the module with alcohol are in this example a sponge 32 dipping into a bath 33 of 95° ethyl alcohol in a container. The sponge is kept continuously in contact with the module supply film. These means enable the cyanoacrylate glue or gel to be activated so as to create an immediate bond with the module and/or reestablish differences in bonding of the glue or the gel relative to the module and the card.

The means of moving the cards from one station to the other are mechanized to produce a rate of at least 2000 cards per hour.

Operation

When a card arrives at resin dispensing station 23, dispensing needle 16 is positioned above the location of central point 11*a* corresponding to the intended trace (FIG. 5) then descends to near the surface of the cavity, and a control system (not shown) causes 0.003 gram of resin to be delivered and deposited in the cavity; the needle then rises in such a way as to break off a filament of residual resin that tends to cling to the needle and returns to the standby position awaiting the next card. The control means are set to allow descent, dispensing, and rising in 1.5 seconds, after which the cards are transferred to irradiation station 24.

At this station, the resin is exposed to ultraviolet radiation (UV) for 0.5 to 1 second to allow a resin open time of 60 seconds, and the cards are transferred to station 25 dispensing cyanoacrylate drops.

At the dispensing station, two needles 17 and 18 are positioned at points 12*a* corresponding to the intended trace, are lowered, dispense four 0.001 gram drops which are deposited on the cavity, then rise to await the next cards, and the cards are transferred to insertion station 26*b*.

At this station, the cards receive a module, the insertion time being 300 ms, and the cards are transferred to pressing station 27.

At this station, each module is pressed against the card body, the force applied being 34 daN. The cards stay on the carousel for 22 seconds and are then ejected to the next station.

As they leave the carrousel, the cards may be tested and sent to storage means 31.

What is claimed is:

1. A method for making an electronic module card in which a card body (1) with a cavity (2) is provided with an electronic module (5) whose dimensions match said cavity, and in which at least a first gluing means (12*c* to 15) which is adhered to the card body and to the module, wherein at least said first gluing means is deposited in said cavity, said module is inserted into the cavity in a substantially centered position, and at least said first gluing means is pressed between the card and the module;

providing a second gluing means (11*b*) which is also deposited in the cavity (2), said second gluing means keeps module (5) centered in the cavity until said first gluing means is pressed.

2. The method according to claim 1, characterized in that the second gluing means is selected from materials that are able to withstand bending and/or twisting.

3. The method according to claim 1, characterized in that a single-component light-curable epoxy resin is used.

4. The method according to claim 3, characterized in that the resin has a viscosity of 50 p/s.

5. The method according to claim 3, characterized in that a drop of 0.003 gram is deposited in the center of the cavity, and the resin is exposed to radiation so that the resin open time is greater than or equal to approximately 60 seconds.

6. The method according to claim 1, characterized in that a cyanoacrylate glue gel is used.

7. The method according to claim 6, characterized in that a drop of gel is deposited in the center of the cavity at a temperature and some relative humidity conditions being between 18 and 24 degrees Celsius and between 60 and 75%, respectively.

8. The method according to claim 1, characterized in that a glue of a cyanoacrylate type is used as the first gluing means.

9. The method according to claim 8, characterized in that the gluing quantity deposited is such that, after pressing, provides a gluing area of between 50 and 100% of the area of said cavity, said glue being deposited in the form of at least four lateral glue dots (12*c* to 15*c*) in the location of contact pads at a temperature of 18 to 24 degrees Celsius and a relative humidity of between 60 and 75%.

10. The method according to claim 9, characterized in that a relatively pure cyanoacrylate glue is chosen, the open time of the cyanoacrylate glue being greater than or equal to approximately 60 seconds.

11. The method according to claim 8, characterized in that the cyanoacrylate glue is deposited just before the insertion of the module.

12. The method according to claim 1 is a method of producing electronic module cards.

* * * * *